(12) United States Patent
Shirasaki et al.

(10) Patent No.: US 7,830,084 B2
(45) Date of Patent: Nov. 9, 2010

(54) DISPLAY PANEL

(75) Inventors: Tomoyuki Shirasaki, Higashiyamato (JP); Minoru Kumagai, Tokyo (JP); Hiroyasu Yamada, Hachioji (JP); Tsuyoshi Ozaki, Fuchu (JP); Jun Ogura, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 388 days.

(21) Appl. No.: 11/541,005

(22) Filed: Sep. 29, 2006

(65) Prior Publication Data

US 2007/0075638 A1 Apr. 5, 2007

(30) Foreign Application Priority Data

Sep. 30, 2005 (JP) ............................. 2005-286449

(51) Int. Cl.
  *H01J 1/62* (2006.01)
  *H01J 63/04* (2006.01)
(52) U.S. Cl. ..................... 313/505; 313/503; 313/504; 313/506; 257/40; 345/30; 345/45; 345/46; 345/55; 345/76
(58) Field of Classification Search .......... 313/503–506; 257/40, 79; 345/30, 36, 44, 45, 46, 55, 58, 345/76, 80, 82, 83
See application file for complete search history.

(56) References Cited

U.S. PATENT DOCUMENTS

| 6,194,837 | B1 | 2/2001 | Ozawa | |
|---|---|---|---|---|
| 6,373,453 | B1 * | 4/2002 | Yudasaka | 345/76 |
| 6,380,672 | B1 * | 4/2002 | Yudasaka | 313/504 |
| 6,642,651 | B2 * | 11/2003 | Yudasaka | 313/504 |
| 6,885,148 | B2 * | 4/2005 | Yudasaka | 313/504 |
| 7,023,407 | B2 * | 4/2006 | Nakanishi | 345/76 |

(Continued)

FOREIGN PATENT DOCUMENTS

JP 08-330600 A 12/1996

(Continued)

OTHER PUBLICATIONS

Japanese Office Action dated Jun. 15, 2010 and English translation thereof, issued in counterpart Japanese Application No. 2005-286449.

*Primary Examiner*—Nimeshkumar D Patel
*Assistant Examiner*—Thomas A Hollweg
(74) *Attorney, Agent, or Firm*—Holtz, Holtz, Goodman & Chick, PC

(57) ABSTRACT

A display panel including a plurality of pixels. Each pixel includes: a light emitting element; a pixel circuit having a driving transistor connected to the light emitting element in series; a data line to which a data current is supplied through the pixel circuit; a scanning line for selecting the pixel circuit; a first insulation film to cover the data line; and a second insulation film made of a material different from the first insulation film, to cover the data line and the first insulation film, wherein the following expression is satisfied.

$$\frac{C_{total}}{20} \leq \varepsilon_0 \frac{\varepsilon_a \varepsilon_b}{\varepsilon_a D_b + \varepsilon_b D_a} \leq \frac{C_{total}}{5}$$

$C_{total}$: parasitic capacitance of whole path to data line through pixel circuit; $\varepsilon_0$: vacuum dielectric constant; $\varepsilon_a$: relative dielectric constant of first insulation film; $D_a$: first insulation film thickness; $\varepsilon_b$: relative dielectric constant of second insulation film; $D_b$: second insulation film thickness.

12 Claims, 10 Drawing Sheets

U.S. PATENT DOCUMENTS

| | | | |
|---|---|---|---|
| 7,248,236 B2 * | 7/2007 | Nathan et al. | 345/76 |
| 7,414,600 B2 * | 8/2008 | Nathan et al. | 345/82 |
| 7,535,169 B2 * | 5/2009 | Kobayashi | 313/506 |
| 2002/0097363 A1 * | 7/2002 | Yudasaka | 349/138 |
| 2004/0129933 A1 * | 7/2004 | Nathan et al. | 257/40 |
| 2004/0130516 A1 * | 7/2004 | Nathan et al. | 345/82 |
| 2005/0116620 A1 | 6/2005 | Kobayashi | |
| 2005/0118751 A1 * | 6/2005 | Yamazaki et al. | 438/149 |
| 2005/0122288 A1 * | 6/2005 | Fish et al. | 345/76 |
| 2005/0179373 A1 * | 8/2005 | Kobayashi | 313/506 |
| 2006/0132051 A1 * | 6/2006 | Fish et al. | 315/169.3 |
| 2010/0133988 A1 * | 6/2010 | Kim | 313/504 |

FOREIGN PATENT DOCUMENTS

| | | |
|---|---|---|
| JP | 2000-286426 A | 10/2000 |
| JP | 2004-046209 A | 2/2004 |
| KR | 2005-043625 | 5/2005 |
| KR | 2005-084467 | 8/2005 |

* cited by examiner

DISPLAY PANEL

CROSS-REFERENCE TO RELATED APPLICATIONS

This application is based upon and claims the benefit of priority from the prior Japanese Patent Application No. 2005-286449 filed on Sep. 30, 2005 and the entire contents of which are incorporated herein by reference.

BACKGROUND OF THE INVENTION

1. Field of the Invention

The present invention relates to a display panel including pixels each provided with a light emitting element.

2. Description of Related Art

An organic electroluminescence element has a laminated structure, for example, of an anode, an organic compound layer and a cathode stacked on a substrate. When a voltage is applied between the anode and the cathode, positive holes and electrons are injected into the organic compound layer to generate an electric field, thereby to emit light.

In a display panel of an active matrix driving type, a plurality of thin film transistors are provided for each pixel or dot, which allow the organic electroluminescence element to emit light. For example, in the display panel disclosed in JP-H8-330600A, two thin film transistors are provided for each pixel. A plurality of organic electroluminescence elements are formed and disposed in a matrix arrangement by a patterning process, and also in the patterning process, anodes are formed independently from each other in a bottom layer side which is connected to the thin film transistors. Meanwhile, the cathode is formed as a single film of a counter electrode to all pixels.

In order to drive the display panel, there are provided a plurality of scanning lines and signal lines on the display panel. When the display panel is driven, a signal is sequentially sent to the scanning lines to sequentially select the scanning lines, and signals corresponding to gradients are output while the scanning lines are selected, whereby a gradient signal is written on the pixel locating at the cross point of the selected scanning line and the signal line.

With respect to the driving system of the display panel, there are two systems: one is a voltage designating system for performing control according to a voltage value of a gradient signal to be output to the signal lines, and the other is a current designating system performing control according to a current value of a gradient signal to be output to the signal lines. In the voltage designating system, since the signal to be applied to the signal lines is a voltage, a signal reaches a predetermined potential in a certain time when a parasitic capacitance exists in the signal lines in some measure. Such a delay due to a parasitic capacitance exerts a large influence to a display of the current designating system, in particular. That is, in the current designating system, since the light emitting element itself can emit light with a weak current, a weak current flowing through the signal lines is enough, however, when the parasitic capacitance associated with lines is large, the current takes a time to reach a predetermined current value.

SUMMARY OF THE INVENTION

The present invention has been developed to solve the above problem. Therefore, an object of the invention is to provide a display panel in which the current delay caused by parasitic capacitance is reduced to the minimum.

According to one aspect of the present invention, the display panel includes a plurality of pixels, each of the pixels comprising:
a light emitting element;
a pixel circuit having a driving transistor connected to the light emitting element in series;
a data line to which a data current is supplied through the pixel circuit;
a scanning line for selecting the pixel circuit;
a first insulation film to cover the data line; and
a second insulation film made of a material different from the first insulation film, to cover the data line and the first insulation film,
wherein the following expression is satisfied:

$$\frac{C_{total}}{20} \leqq \varepsilon_0 \frac{\varepsilon_a \varepsilon_b}{\varepsilon_a D_b + \varepsilon_b D_a} \leqq \frac{C_{total}}{5}$$

where $C_{total}$ denotes a parasitic capacitance of a whole path to the data line through the pixel circuit, $\varepsilon_0$ denotes a vacuum dielectric constant, $\varepsilon_a$ denotes a relative dielectric constant of the first insulation film, $D_a$ denotes a thickness of the first insulation film, $\varepsilon_b$ denotes a relative dielectric constant of the second insulation film, and $D_b$ denotes a thickness of the second insulation film.

Preferably, the second insulation film has a relative dielectric constant of 2.6 to 3.4, and has a thickness of 2.0 to 17.7 μm.

In the above-described display panel, the first insulation film may include the gate insulation film of the driving transistor, or may include an overcoat insulation film to cover the driving transistor, or may include a protection film which is formed together with a channel protection film by patterning a layer which comes to be the channel protection film of the driving transistor.

Further, in the above-described display panel, the first insulation film may have at least two of a gate insulation film, an overcoat insulation film and a channel protection film, and the at least two of a gate insulation film may have the same relative dielectric constant.

In the above-described display panel, the first insulation film may have at least two of a gate insulation film, an overcoat insulation film and a channel protection film, and the at least two of a gate insulation film may be made of the same material.

In the display panel, the light emitting element may have an organic compound layer, and the second insulation film may form a partition wall to divide the organic compound layer into lines of the pixels.

In the above-described display panel, a counter electrode may be formed on the second insulation film.

Preferably, in the above-described display panel, the pixel circuit is one of a current-drive type which supplies a driving current having a current value on the basis of the current value of the data current flowing through the data line.

According to the display panel of the invention, it is possible to suppress delay in the data line by setting a thickness of the partition wall.

THE PREFERRED EMBODIMENT OF THE INVENTION

Figure 1:
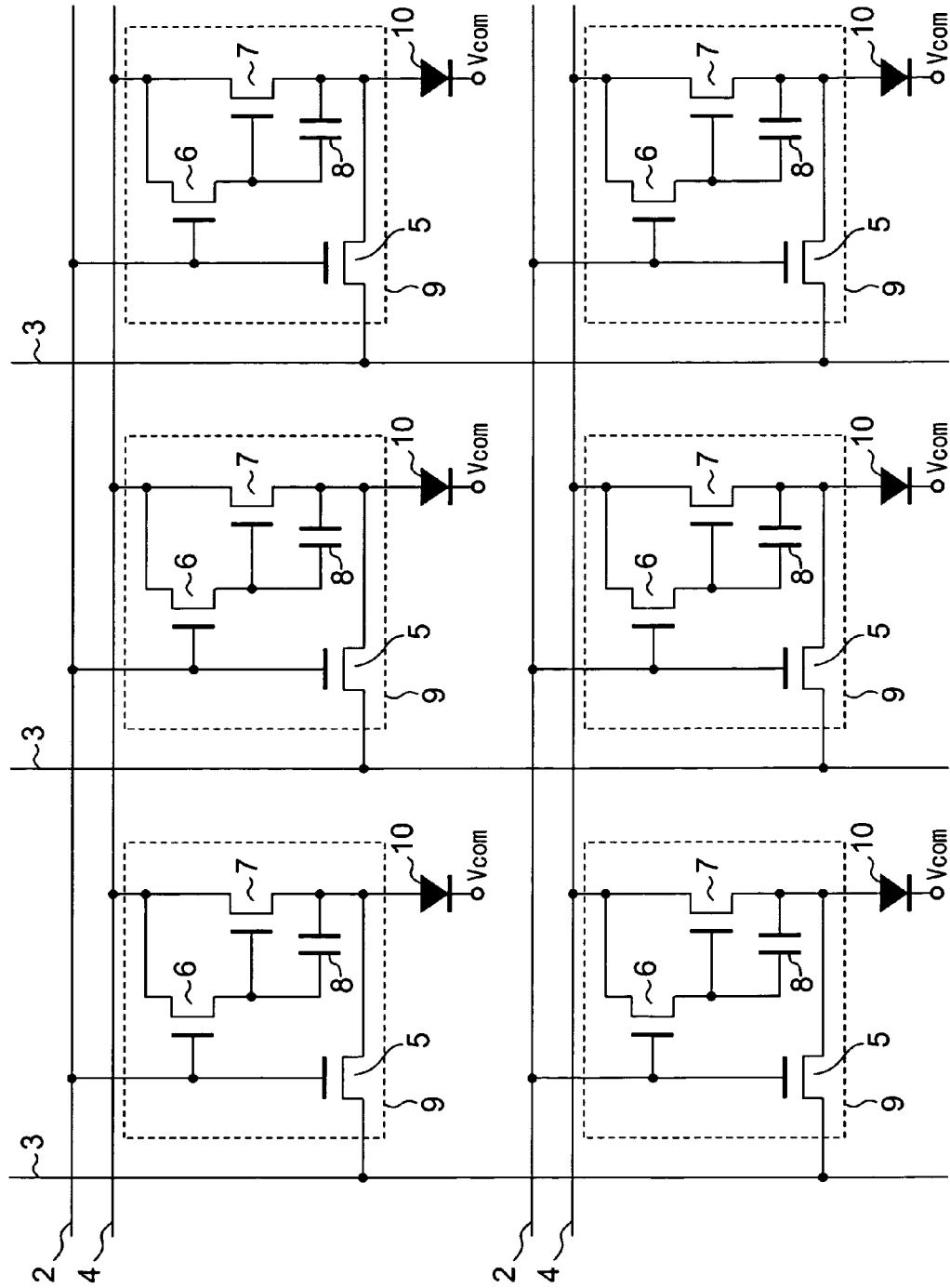
FIG. 1 is a circuit diagram of an EL display panel 1.

Preferred embodiments of the invention will be described with reference to the accompanying drawings. The embodiments of the invention refer various technical limitations preferred to carry out the invention, however do not restrict the scope of the invention to the embodiments and examples illustrated in the drawings below. Throughout the description below, an abbreviated expression "EL" stands for "Electro Luminescence".

FIG. 1 is a circuit diagram of a plurality of pixels in an EL display panel 1 of an active-matrix driving type, employing a current-writing system. In FIG. 1, only pixels of 2 rows by 3 columns is shown for simplicity, however, a practical display panel has a larger number of pixels disposed in rows and columns.

As shown in FIG. 1, the EL display panel 1 is provided with a plurality of scanning lines 2 disposed in parallel with each other, and a plurality of data lines 3 disposed so as to intersect the scanning lines 2, and further provided with supply lines 4 each disposed in parallel with the scanning line 2 and between the adjacent scanning lines 2. A pixel is formed in a rectangular area defined by the adjacent two scanning lines 2 and two data lines 3. The EL display panel 1 includes a plurality of pixels which are disposed in a matrix arrangement.

Each pixel comprises a pixel circuit 9 which includes thin film transistors 5, 6 and 7 and a capacitor 8; and an organic EL element 10. Hereinafter, the thin film transistor 5 is referred to as a switch transistor 5, the thin film transistor 6 as a hold transistor 6, and the thin film transistor 7 as a driving transistor 7. Each of the switch transistor 5, the hold transistor 6 and the driving transistor 7 may be an n-channel type of amorphous silicon transistor.

In each pixel, a gate of the switch transistor 5 is connected to the scanning line 2, and one of the drain and the source of the switch transistor 5 is connected to the data line 3, and the other of the drain and the source of the switch transistor 5 is connected to an anode of the organic EL element 10, to one of electrodes of the capacitor 8, and also to one of the source and the drain of the driving transistor 7. The other of the source and drain of the driving transistor 7 is connected to the supply line 4. The gate of the driving transistor 7 is connected to the other electrode of the capacitor 8 and further to one of the drain and source of the hold transistor 6. The other of the drain and source of the hold transistor 6 is connected to the supply line 4, and a gate of the hold transistor 6 is connected to the scanning line 2.

Each of the organic EL elements 10 of the pixels has a cathode as a counter electrode, which is kept at a constant voltage $V_{com}$, for example, ground potential. Concerning emission colors of the organic EL elements 10, the organic EL elements 10 in the same row are disposed to have colors of red, green and blue, in this order. The organic EL elements 10 disposed in the same column has the same color. It is preferable for the cathode to have a laminated structure of an electron injection layer made of Ba having a thickness of not larger than 10 nm and a protection conductive layer, e.g., aluminum, for covering the electron injection layer, which has a higher work function than the electron injection layer. When applied with a predetermined voltage, among a thickness of Ba layer of 10 nm, 50 nm and 100 nm, the organic EL element 10 shows the maximal brightness at a thickness of 10 nm and shows the lowest brightness at a thickness of 100 nm.

Figure 9:
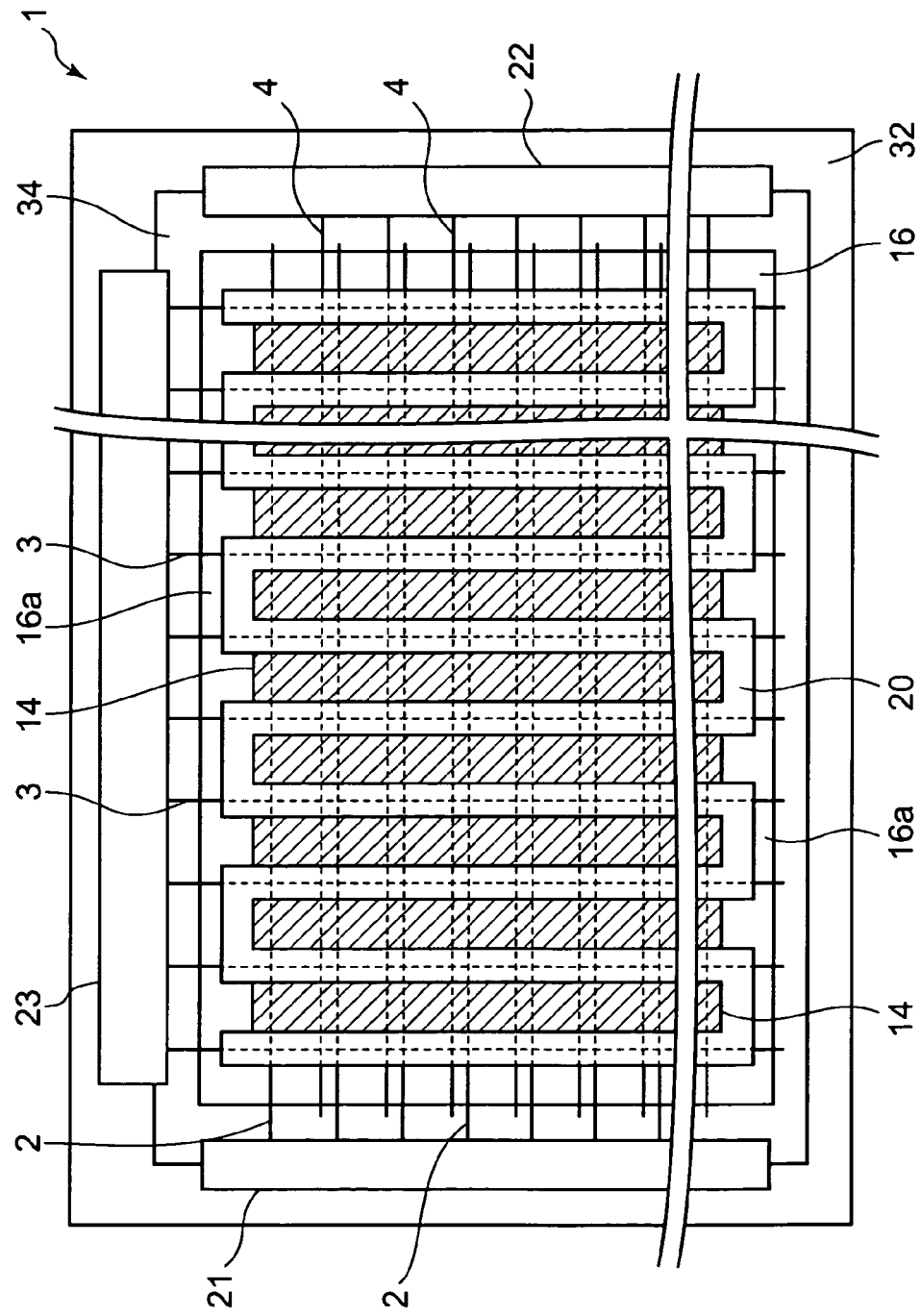
FIG. 9 is a schematic plan view showing the whole EL display panel 1.
Figure 10:
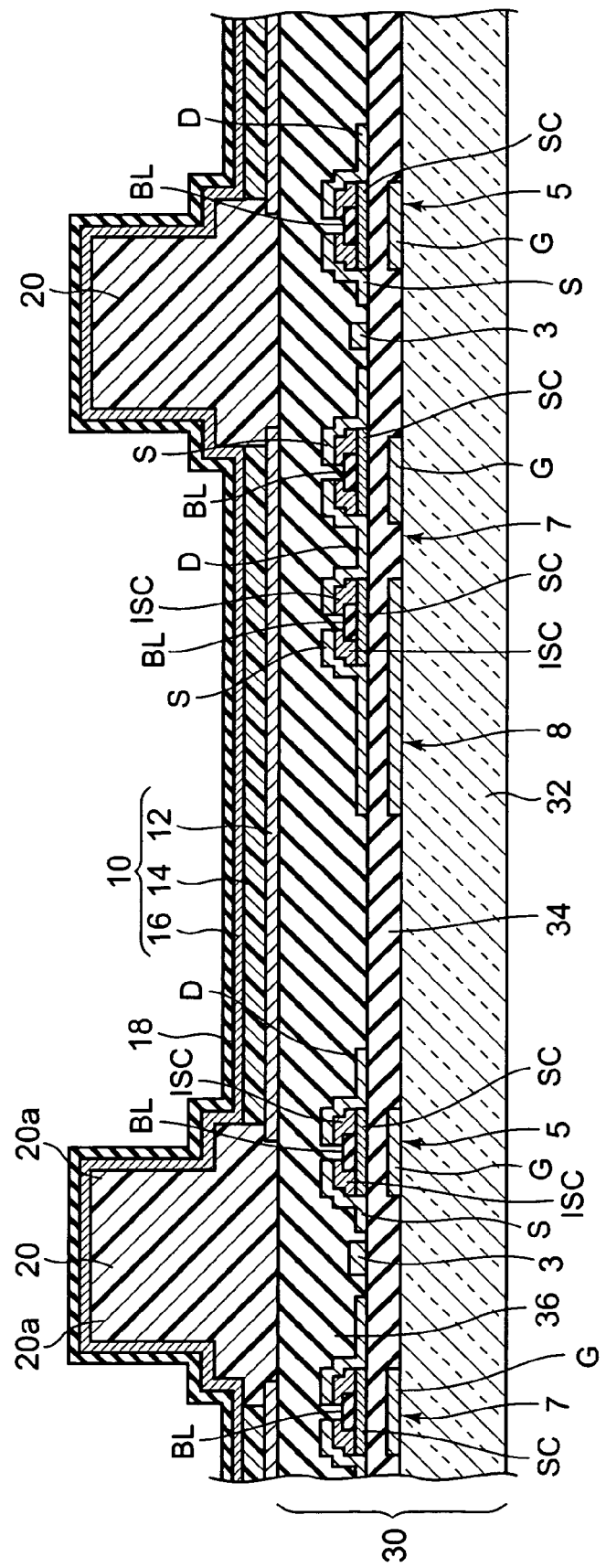
FIG. 10 is a cross sectional view taken along the line V-V in FIG. 4 according to a modification of the invention in which the arrangement of the data line is changed.

As shown in FIG. 9, in a peripheral area of the EL display panel 1, the scanning lines 2 are connected to a first scanning-line driver 21 for controlling a voltage, and the supply lines 4 are connected to a second scanning-line driver 22 for controlling a voltage, and the data lines 3 are connected to a data-line driver 23 for controlling a current. The EL display panel 1 is driven by these drivers in the active matrix driving manner.

Figure 2:
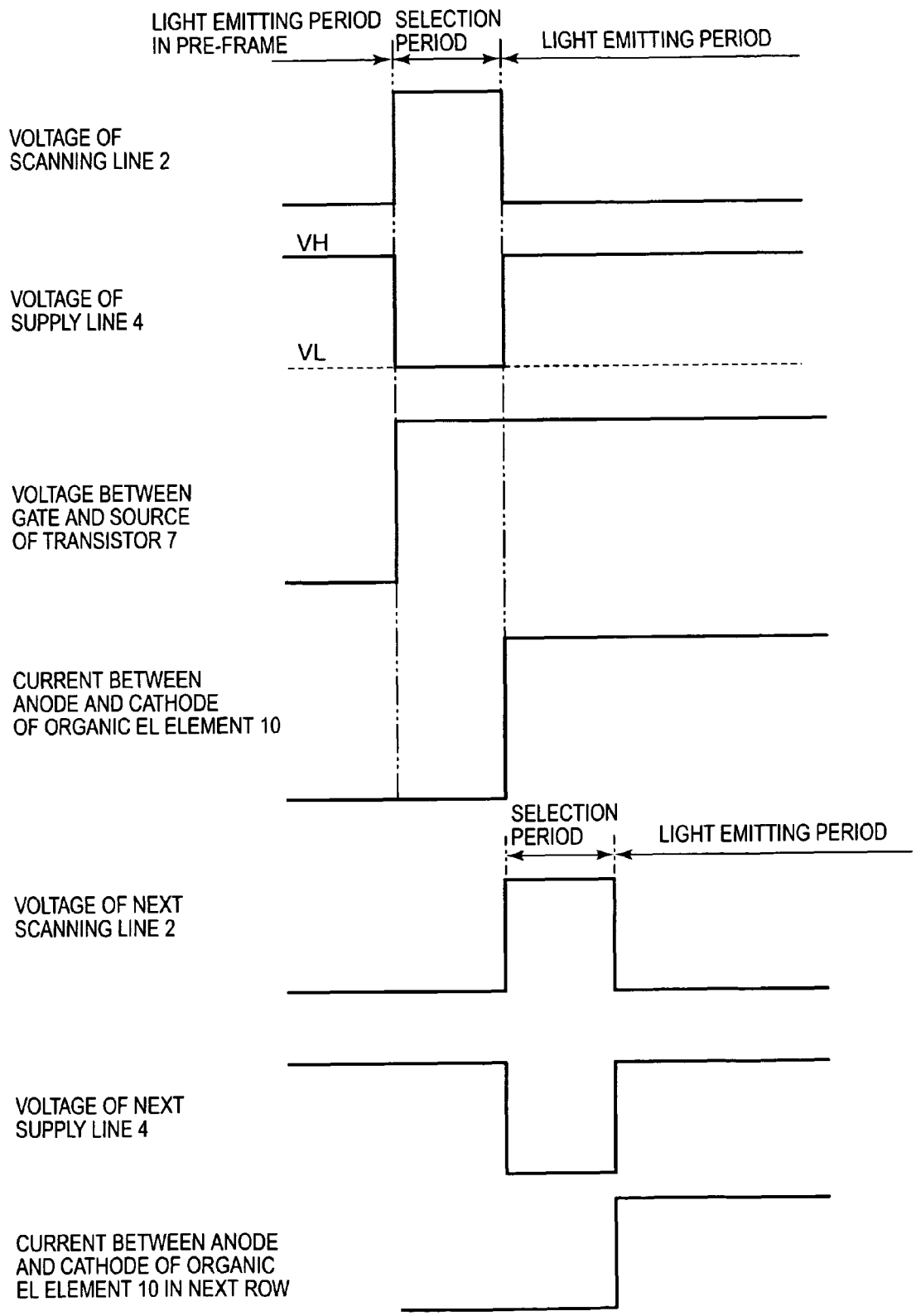
FIG. 2 is a timing chart of signals for driving the EL display panel 1.

FIG. 2 is a timing chart showing signals to be supplied to a plurality of adjacent pixels, that is, one pixel locating at an intersection of a certain row out of a plurality of rows and a certain column out of a plurality of columns, and another pixel locating at another intersection of a row next to the above row and the above column. As shown in FIG. 2, the first scanning-line driver 21 applies a voltage of an ON-level, i.e., a voltage of a constant high level, to the scanning lines 2 successively, thereby selecting the switching transistors 5 and the hold transistors 6 successively. Meanwhile, the second scanning-line driver 22 applies a write voltage of a constant low level, i.e., not higher than the voltage $V_{com}$ supplied to the cathodes of the organic EL elements, to the supply lines 4 successively in synchronism with an output of ON-level from the first scanning-line driver 21, and thereby all the pixel circuits 9 on a column connected with the supply line 4 are successively selected every row. While the first scanning-line driver 21 selects the switching transistors 5 and the hold transistors 6 on each row, the data-line driver 23 controls a data current flow so as to allow current of current values corresponding to respective gradients to flow between the drain-source of the driving transistor 7, through the data lines 3 in each column. Data current is a pull-out current flowing from the data lines 3 to the data-line driver 23. The data current is a sink current which flows to the data-line driver 23 through the data lines 3. Hereinafter, a period during which the scanning line 2 in a row is kept at ON-level is referred to as a "selection period" of the row, and a period during which the scanning line 2 in a row is kept at an OFF-level (a constant low level) is referred to as "light emitting period" of the row.

In the selection period of a row, since the scanning line 2 of the row is kept at ON-level, the switching transistors 5 and the hold transistors 6 of all the pixels on the row remain in an ON-state. At this time, the write voltage of the supply line 4 is kept at a low level, and the data-line driver 23 keeps a potential lower than the write voltage of the supply line 4 so as to allow data currents of desired current values corresponding to gradients to flow through the data lines 3. Therefore, the driving transistor 7 is supplied with voltages such that the gate-source and the drain-source are brought in an ON state. As a result, data currents of current values corresponding to respective gradients are supplied to the data lines 3 from the supply lines 4 through the drain-source of the driving transistor 7 and the drain-source of the switching transistor 5, thereby data currents flow in each of pixels on the row toward the data lines 3. The current value of the data current is unambiguously adjusted by the data-line driver 23. At this time, the potential difference between the gate and the source of the driving transistor 7 becomes equal to the potential difference between the drain and the source of the driving transistor 7, that is, the current value is automatically set so as to correspond to the current value of the data current set by the data-line driver 23 to flow through the drain-source of the driving transistor 7. The electric charge with a level due to the potential difference is charged in the capacitor 8.

Thereafter, in the light emitting period, the scanning line 2 in the row is kept at OFF-level, i.e., in a constant low level, and the switching transistors 5 and the hold transistors 6 are brought in an off state. However, the potential difference between the both ends of the capacitor 8 is kept because of the hold transistors 6 being in an off state, and the potential difference between the gate and the source of the driving transistor 7, which was applied in the selection period, is kept as it is. Therefore, the potential difference between the gate and the source of the driving transistor 7 is memorized so as to allow a current corresponding to the current value of the data current to flow during the light emitting period. During the light emitting period, even though the voltage of the supply line 4 is switched to a light emission voltage of a constant high level from the low level and raised to a voltage which is higher than the constant voltage $V_{com}$ at the cathode of the organic EL element 10, despite the current value of the data current, the voltage between the drain and the source of the driving transistor 7 is set to a voltage that allows a saturation current to flow through the drain-source of the driving transistor 7. Accordingly, a current value of a driving current for driving the organic EL element 10 is decided only by the voltage between the gate and the source of the driving transistor 7. Since the voltage between the drain and the source of the driving transistor 7 is held as a voltage corresponding to the current value of the data current which flow between the drain and the source of the driving transistor 7 in the selection period, the current value of the driving current to flow to the organic EL element 10 in the light emitting period depends on the current value of the data current in the selection period. Thus, the driving current is supplied from the supply line 4 to the organic EL element 10 through the driving transistor 7, thereby to make the organic EL element 10 emit light. Preferably, the current value of the driving current in the light emitting period is substantially equivalent to the current value of the data current in the selection period just before the light emitting period. As described above, the driving transistor 7 is connected in series with the organic EL element 10, to supply the driving current to the organic EL element 10.

In each pixel circuit 9, there exists parasitic capacity associated with a path of the data current from the supply line 4 to the data line 3, and therefore a certain time is required before the data current actually flowing through the pixel circuit 9 reaches the level of data current adjusted by the data-line driver 23. When the certain time is shorter than the selection period, no trouble is caused. Meanwhile, when the certain time is longer than the selection period, the data current actually flowing through the pixel circuit 9 does not reach the level adjusted by the data-line driver 23, and the voltage which is lower than a predetermined voltage is applied between the gate and the source of the driving transistor 7, whereby the current value of the current flowing through the organic EL element 10 is reduced, making the organic EL element emit light only at a brightness less than a predetermined one. Therefore, the embodiment of the invention provides the optimal structure of EL display panel 1.

The structure of EL display panel 1 will be described in particular.

Figure 3:
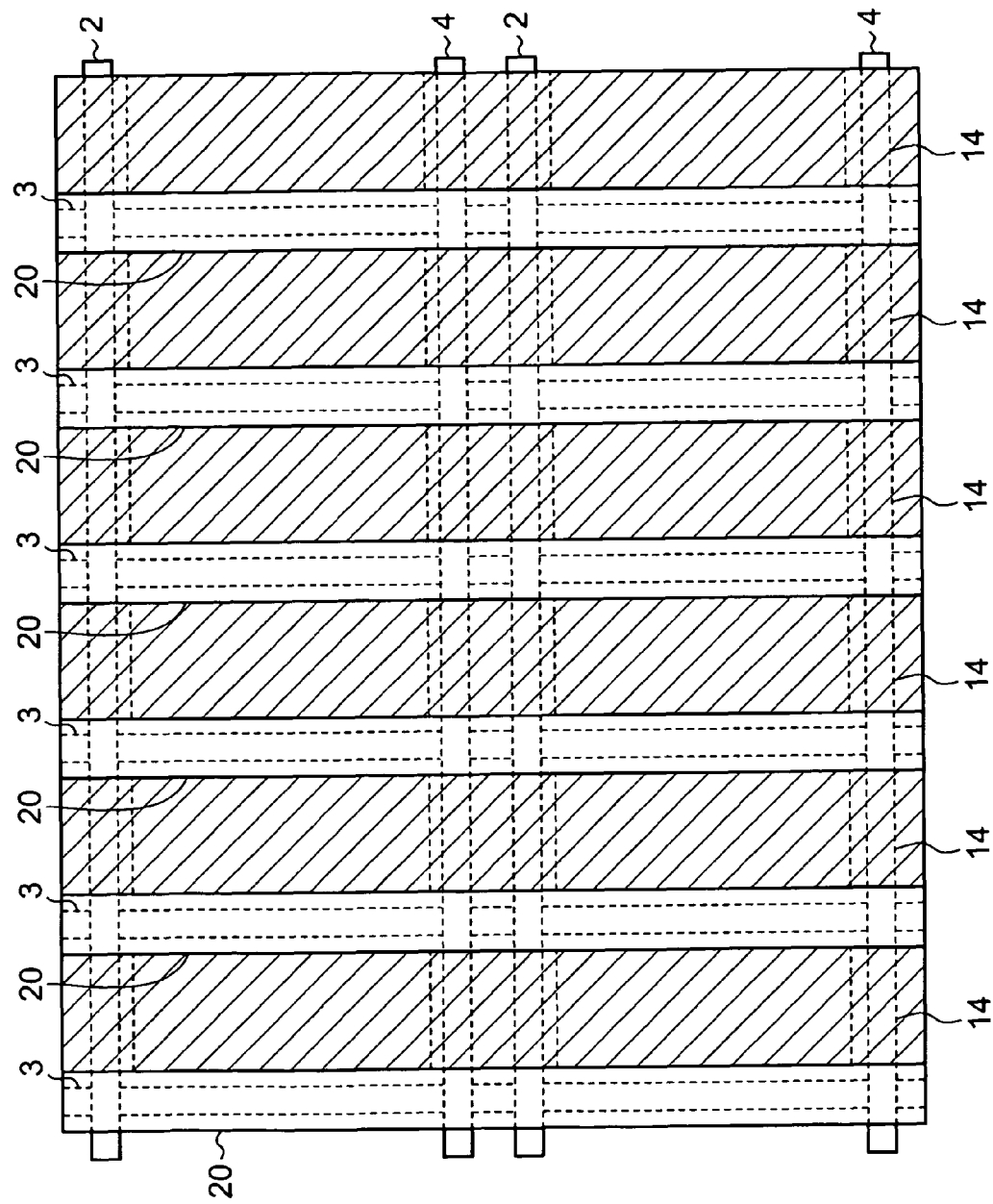
FIG. 3 is a schematic plan view illustrating pixels arranged in 2 rows by 6 columns on the EL display panel 1.

FIG. 3 is a schematic plan view of EL display panel 1 including pixels disposed in 2 rows by 6 columns. As shown in FIG. 3, between the scanning line 2 and the supply line 4 in the same row, the same number of pixel electrodes as the number of columns are disposed. Pixel electrodes as a whole are disposed in a matrix arrangement. Between data lines 3 adjacent to each other, pixel electrodes are disposed in the column direction. On each data line 3, there is provided a partition wall 20 so as to coat the data line 3. As shown in FIG. 9, the partition wall 20 has a continuous snaking structure. On a plurality of pixel electrodes 12 disposed between portions of the partition wall 20 in the column direction, an organic compound layer 14 is continuously formed. The organic compound layers 14 adjacent to each other, disposed in the row direction are separated by the partition wall 20 running in the column direction. The organic compound layer 14 includes an organic EL light emission layer which emits light when a current flows through the layer, or one or a plurality of carrier transporting layers. The organic compound layer 14 is formed by pouring a solution which is prepared by dissolving a material for the organic compound layer 14 in a solvent, or by pouring a dispersion liquid in which a material for the organic compound layer 14 is dispersed, between the adjacent partition wall portions 20 and 20 and thereafter by drying them. The partition wall 20 has an electric insulation property and is made of a photosensitive organic resin such as polyimide. In the case where the partition wall 20 is made of an organic resin, a liquid repellent finishing is subjected to the outermost surface of the partition wall 20 by replacing C—H bonding among constituent elements of the partition wall 20 with C—F bonding to enhance the liquid repellency of the partition wall 20, resulting in that the partition wall 20 shows a low relative dielectric constant.

Figure 4:
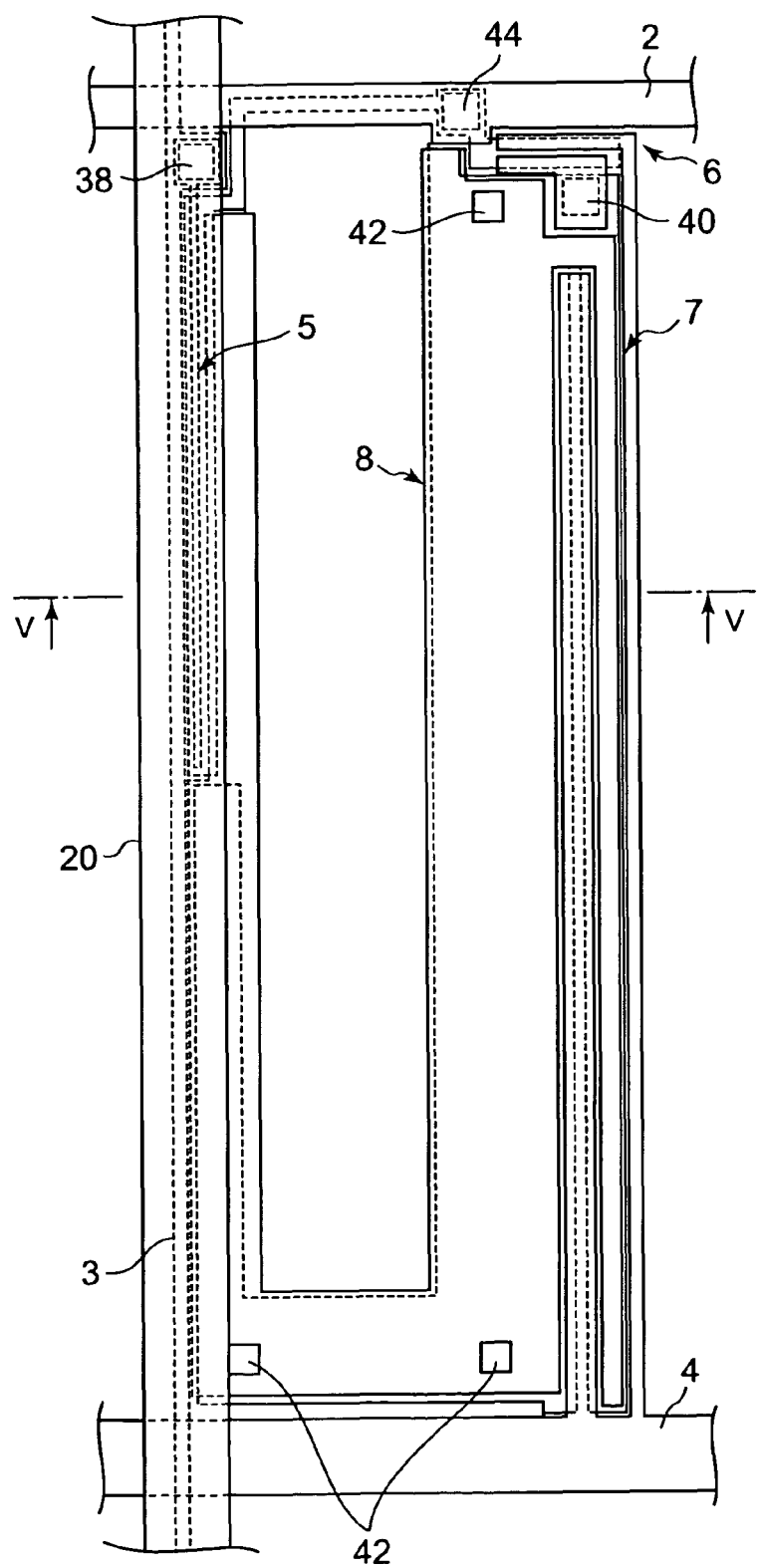
FIG. 4 is a plan view illustrating electrodes for one pixel.
Figure 5:
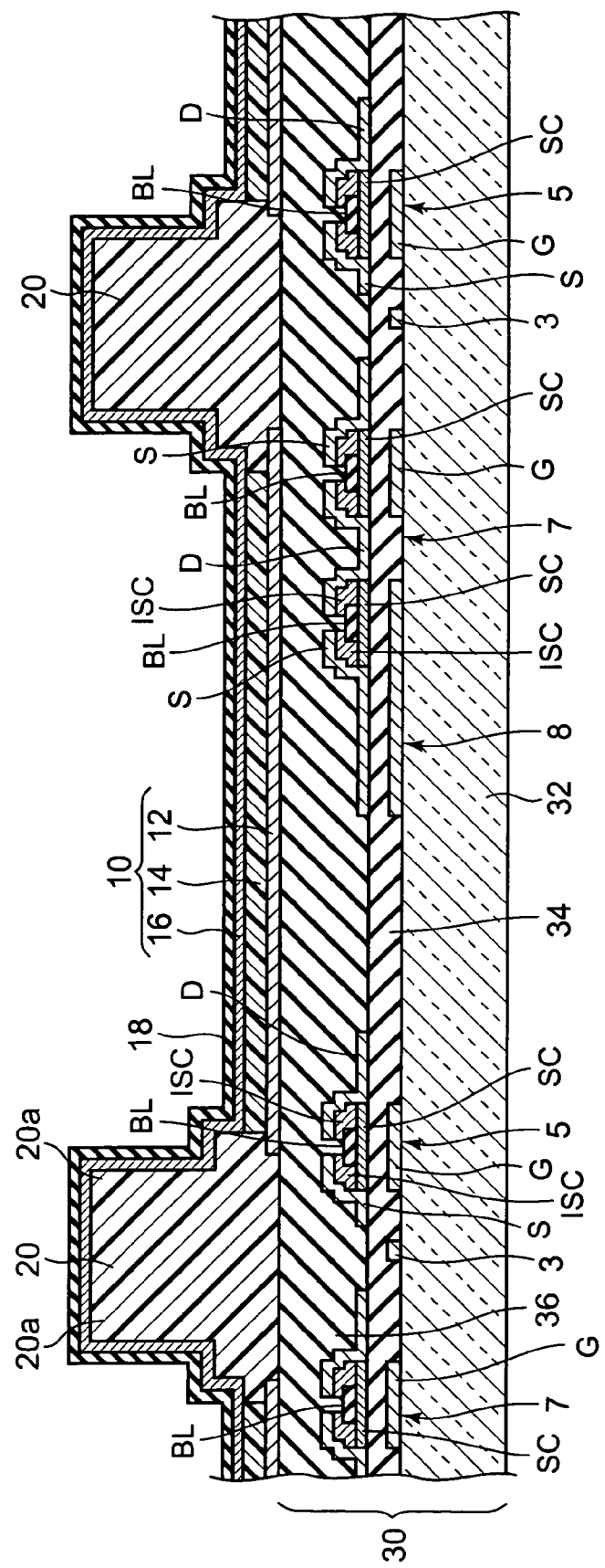
FIG. 5 is a cross sectional view taken along the line V-V in FIG. 4.

FIG. 4 is a plan view illustrating electrodes for one pixel. FIG. 5 is a cross sectional view taken along the line V-V of FIG. 4. As shown in FIGS. 4 and 5, the pixel electrode 12 which is an anode of the organic EL element 10 is formed under the organic compound layer 14, and the counter electrode 16 which is a cathode of the organic EL element 10 is formed above the organic compound layer 14. That is, the organic EL element 10 comprises a laminated structure of the pixel electrode 12, the organic compound layer 14 and the counter electrode 16, which are stacked in the above order from bottom. The pixel electrodes 12 for respective pixels are formed independently from one another and arranged in a matrix arrangement. The counter electrode 16 is one electrode provided commonly to all the pixels and formed all over the panel surface, with covering also partition walls 20. Further, the counter electrode 16 is covered with the protection insulating film 18. In FIG. 4, illustration of the pixel electrodes 12 are omitted for simplicity, however, the pixel electrode 12 is formed in a region including a rectangular frame portion at the left to the capacitor 8 and a portion corresponding to the capacitor 8.

Each of the pixel electrodes 12 has a transparent conductive film made of tin doped indium oxide (ITO), zinc doped indium oxide, indium oxide ($In_2O_3$), tin oxide ($SnO_2$), zinc oxide (znO), and/or cadmium-tin oxide (CTO).

The organic compound layer 14 has, for example, a double layer structure formed on the pixel electrodes 12, including a hole carrying layer and a light emission layer stacked on the hole carrying layer. The hole carrying layer is made of a conductive polymer such as PEDDOT (polyethylenedioxythiophene) and a dopant such as PSS (polystyrene sulfone acid). Conjugate double bond polymer luminescence materials such as polyphenylene vinylene luminescence materials and polyfruorene luminescence materials are preferably used to form the light emission layer. The organic compound layer 14 may have a single layer structure or a laminated structure of more than two layers.

The counter electrode 16 is made of a material having a work function lower than the pixel electrode 12. For example, the counter electrode 16 is made of a material such as indium, magnesium, calcium, lithium, valium or a rare-earth metal, or an alloy including at least one sort of the above materials. Further, the counter electrode 16 may have a laminated structure of layers made of the above material, or the laminated structure with an alloy layer-stacked on top of the above laminated structure. More specifically, the counter electrode 16 may have the laminated structure comprising a layer of high purity valium having a low work function, formed on the surface boundary of the organic compound layer 14 and a layer of aluminum coating over the valium layer, or the laminated structure comprising lithium layer and aluminum layer stacked on top of the lithium layer.

On the front surface of a transistor array panel 30, The scanning lines 2, data lines 3, supply lines 4, switching transistors 5, hold transistors 6, driving transistors 7 capacitors 8, pixel electrodes 12 and partition walls 20 are formed.

The transistor array panel 30 has a transparent insulating substrate 32 as a base. On the insulating substrate 32, patterning of insulating film, conductive film, semiconductor film, and impurity semiconductor film are performed to form scanning lines 2, data lines 3, supply lines 4, switching transistors 5, hold transistors 6, driving transistors 7 and capacitors 8.

The switching transistor 5, the hold transistor 6 and the driving transistor 7 are produced to form a reverse stagger structure. More particularly, each of the switching transistor 5, the hold transistor 6 and the driving transistor 7 comprises a gate G formed on the insulating substrate 32, a gate insulating film 34 covering the gate G, a semiconductor film SC to face the gate G with respect to the gate insulating film 34, a channel protection film BL formed at the central portion of the semiconductor film SC, impurity semiconductor films ISC formed separately from each other on both sides of the semiconductor films SC, a drain D formed on one of the impurity semiconductor films ISC, and a source S formed on the other of the semiconductor films ISC. The gate insulating film 34 is formed all over the area of the data lines 3 and supply lines 4, as shown in FIG. 9. Bumps of the data-line driver 23 are connected to terminals of the data lines 3 which are exposed through contact holes provided in the gate insulating film 34. The counter electrode 16 covers the whole area of the partition wall 20 and is formed so that the peripheral portions 16a surround the partition wall 20. Therefore, as shown in FIG. 5, even if the counter electrode 16 is ruptured at the edges 20a of the partition wall 20, since the peripheral portions 16a of the counter electrode 16 where no partition wall 20 are provided, are continuous, the voltage level throughout the counter electrode 16 can be equalized.

The gates of the switching transistor 5, the hold transistor 6 and the driving transistor 7 are formed by patterning a whole area conductive film formed on the insulating substrate 32. Not only the gates but also data lines 3 and one electrode of the capacitor 8 are formed by patterning the whole area conductive film.

The gate insulating film 34 is formed to cover all over the surface of the insulating substrate 32. The gates of the switching transistors 5, hold transistors 6, and driving transistors 7; the data lines 3; and the one electrode of the capacitor 8 are covered with common gate insulating film 34.

The sources and drains of the switching transistors 5, the hold transistors 6 and the driving transistors 7 are formed by patterning the conductive film formed all over the surface of the gate insulating film 34. In addition to the gates and the drains, the scanning lines 2 and supply lines 4 and the other electrode of the capacitor 8 are also formed by patterning the conductive film. Therefore, the gate insulating film 34 is held between the data lines 3 and the scanning lines 2, and the gate insulating film 34 is held between the data lines 3 and the supply lines 4. The switching transistors 5, the hold transistors 6, the driving transistors 7, the scanning lines 2, supply lines 4 and the other electrodes of the capacitors 8 are covered with a common overcoat insulating film 36. The upper surface of the overcoat insulating film 36 forms the upper surface of the transistor array panel 30. On the upper surface of the over coat insulating film 36, a planarizing film made of a resin or the like may be formed to smooth an uneven surface caused by the scanning lines 2, the supply lines 4, the switching transistors 5, the hold transistors 6, the driving transistors 7 and the capacitors 8. In this case, the smoothed surface of the planarizing film forms the surface of the transistor array panel 30.

In each pixel, the gates of the switching transistor 5 and the hold transistor 6 are connected to the scanning line 2 through a contact hole 44 formed in the gate insulating film 34, and one of the drain and the source of the switching transistor 5 is connected to the data line 3 through a contact hole 38 formed in the gate insulating film 34, and further one of the drain and the source of the hold transistor 6 is connected to one electrode of the capacitor 8 through a contact hole 40 formed in the gate insulating film 34. The other electrode of the capacitor 8 is connected to the pixel electrode 12 through a contact hole 42 formed in the over coat insulating film 36.

The gate insulating film 34 and the over coat insulating film 36 are made of the same insulation material, preferably of silicon nitride or oxide silicon. The partition wall 20 is formed above the data line 3, and further the counter electrode 16 is formed so as to cover the partition wall 16. As a result, the partition wall 20 and the over coat insulating film 36 are held between the counter electrode 16 and data lines 3, whereby a parasitic capacitance $C_{pd}$ is produced.

The parasitic capacitance $C_{pd}$ is represented by the following equation (1).

$$C_{pd} = \varepsilon_0 \frac{\varepsilon_a \varepsilon_b}{\varepsilon_a D_b + \varepsilon_b D_a} \quad (1)$$

where $\varepsilon_0$ denotes the vacuum dielectric constant, $\varepsilon_a$ denotes a relative dielectric constant of the gate insulating film 34 and the over coat insulating film 36, $D_a$ denotes the over all film thickness of the gate insulating film 34 and over coat insulating film 36, $\varepsilon_b$ denotes a relative dielectric constant of the partition wall 20, and $D_b$ denotes a thickness of the partition wall 20. In the case where the gate insulating film 34 and over coat insulating film 36 are made of the same material and the channel protection film BL is held between the counter electrode 16 and data lines 3, $D_a$ will be the over all film thickness of the gate insulating film 34, over coat insulating film 36 and channel protection film BL.

The lower the parasitic capacitance $C_{pd}$ is, the more preferable. When assuming that, within the selection period, the parasitic capacitance associated with the whole circuit for data current from the supply lines 4 to the data lines 3 is expressed by $C_{total}$, in view of the condition that the parasitic capacitance $C_{pd}$ gives no serious effect to design of the transistors 5, 6 and 7, it is preferable for the data lines 3 not to cause considerable delay that the parasitic capacitance $C_{pd}$ is not larger than 20% of the parasitic capacitance $C_{total}$. When the thicknesses of the respective gate insulating film 34, the over coat insulating film 36 and the channel protection film BL of the transistors 5, 6 and 7 are changed, a characteristic of TFT is so seriously affected that the whole circuit design have to be changed. Therefore, it is preferable that the thicknesses of the respective gate insulating film 34, over coat insulating film 36 and channel protection film BL of the transistors 5, 6 and 7 are kept constant. Similarly, when insulation materials of the gate insulating film 34, over coat insulating film 36 and channel protection film BL are changed, that is, the relative dielectric constant of the insulation material is changed, it is required to change the design of the whole circuit. Therefore, it is preferable not to change the insulation material of the insulation films 34, 36 and BL. The equation (1) shows that a parameter which can be varied without inviting a serious problem is the thickness $D_b$ of the partition wall 20. In order to keep the parasitic capacitance $C_{pd}$ less than 5% of the parasitic capacitance $C_{total}$, it is necessary to use a partition wall of layers stacked to a considerable thickness, and usage of such a thick partition wall is not preferable in view of a production process of the partition wall. As a result, the thickness $D_b$ of the partition wall 20 is set so as to meet the following expression (2).

$$\frac{C_{total}}{20} \leqq \varepsilon_0 \frac{\varepsilon_a \varepsilon_b}{\varepsilon_a D_b + \varepsilon_b D_a} \leqq \frac{C_{total}}{5} \quad (2)$$

The parasitic capacitance $C_{total}$ includes capacitance components such as parasitic capacitance at an overlapping potion of the data lines 3 and scanning lines 2, parasitic capacitance at an overlapping potion of the data lines 3 and supply lines 4, parasitic capacitance relating to the product of parasitic capacitance between the gate and source of the switching transistors 5 corresponding to the number of the scanning lines 2 (i.e. capacitance between one of the data lines 3 and the switching transistors 5 connected to supply lines 4), parasitic capacitance at the gates of the driving transistors 7, and capacitance of the pixels 12 and capacitors 8.

Other setting conditions of the EL display panel 1 are set as follows: a width of the pixel (or a pitch of the pixels including the width of the partition wall 20) is not less than 330 μm (in the case of VGA, where a size of EL display panel 1 is 10.4") and not larger than 600 μm (in the case of WXGA, where a size of EL display panel 1 is 37"), the number of the scanning lines 2 is 768 (in the case of WXGA, where a screen is divided into upper and lower half portions, each including 384 scanning lines), 480 (VCA), or 1080 (in the case of a full UD, where a screen is divided into upper and lower half portions, each including 540 lines), a pixel capacitance is 0.252 fF/μm², an aperture ratio (a ratio of a light emitting area against a pixel area) is 30%, the selection period is not longer than 43.4 μsec. (in the case of the longest selection period at 60 Hz drive, that is, in the case of the minimum number of scanning lines 2, WXGA where the screen divided into upper and lower half portions, each including 384 lines), the minimum luminance current is not less than 5.2 nA/dot (where a size of EL display panel 1 is 10.4", VGA, and a gradient is 8 bits, the maximum luminance is from 300 nit to 500 nit, and a characteristic of pixel is set to 12.0 cd/A).

When the pixel can take 256 luminance gradients, the maximum luminance gradient is set to the $255^{th}$ gradient with the no light emission state being set to the $0^{th}$ gradient. For well-balanced display with no gradient reversed every gradient, it is preferable to limit the parasitic capacitance $C_{pd}$ such that a writing ratio will be larger than 20% at the second gradient and the writing ratio will be larger than 90% at $255^{th}$ gradient, where the writing ratio is the measure of a ratio of the driving current actually flowing through the organic EL element 10 to the data current flowing through the data line 3 controlled by the data-line driver 23. The reasons for setting the writing ratio at the second gradient, not at the first gradient, which is the lowest gradient except the $0^{th}$ gradient (the no light emitting state) resides in that a feed through voltage has too large an effect, and is not appropriate as a condition for the writing ratio caused by the parasitic capacitance.

Figure 6:
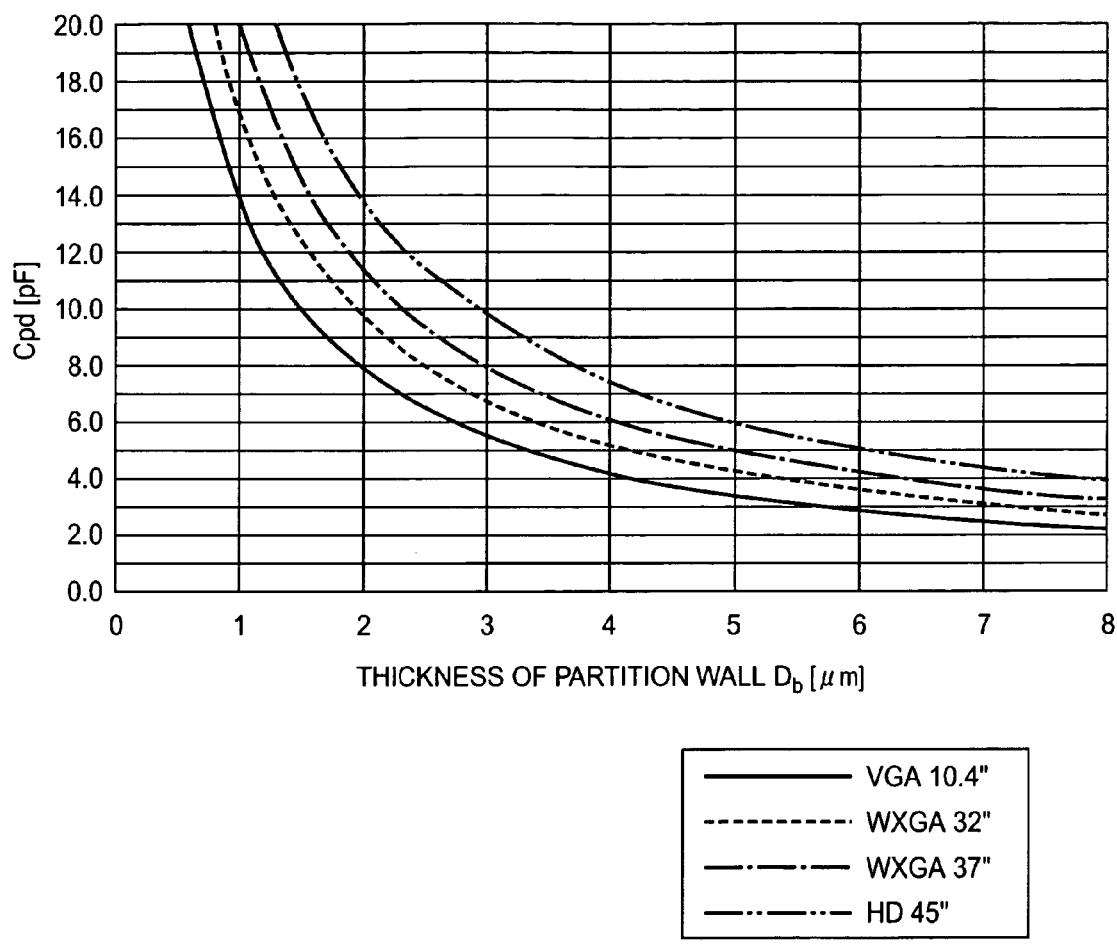
FIG. 6 is a graph showing the relationship between parasitic capacitance $C_{pd}$ and thicknesses $D_b$ of a partition wall 20.

When polyimide is used to make the partition wall 20, the relative dielectric constant $\in_b$ of the partition wall 20 falls within the range from 2.6 to 3.4. For example, when the relative dielectric constant $\in_b$ of the partition wall 20 is 3.0, a relationship between the parasitic capacitance $C_{pd}$ and the thickness $D_b$ of the partition wall 20 is shown in the graph of FIG. 6.

Assuming that various conditions are set as given in TABLE 1 with respect to EL display panel, where each threshold voltage $V_{th}$ of the switching transistor 5, the hold transistor 6 and the driving transistor 7 is set to 0.5 V, each component of the parasitic capacitance $C_{total}$ has been calculated with respect to the whole current flow circuit covering the supply lines 4 and the data lines 3 during the selection period, where the gate insulation film 34, channel protection film BL and over coat insulation film 36 are made of silicon nitride, their relative dielectric constant has been set to 6.4, and the gate insulation film 34 and channel protection file BL are 420 nm thick in total, and further the over coat insulation film 36 is 200 nm thick. The calculation results are given in TABLE 2.

TABLE 1

|  | VGA 10.4" | WXGA 32" | WXGA 37" | HD 45" | REMARKS (UNIT) |
|---|---|---|---|---|---|
| PITCH OF 3 RGB PIXELS | 330 | 500 | 600 | 519 | (μm) |
| THE NUMBER OF SCANNING LINES PER SCANNING LINE DRIVER | 480 | 384 | 384 | 540 | (*1) |
| WIDTH OF SIGNAL LINES AND SCANNING LINES | 4.26 | 4.26 | 4.26 | 4.26 | (μm) |
| WIDTH OF SUPPLY LINES | 25 | 36 | 50 | 50 | (μm) |
| CHANNEL WIDTH OF HOLD TRANSISTOR | 60 | 80 | 120 | 90 | (μm) (*2) |
| CHANNEL WIDTH OF SWITCH TRANSISTOR | 80 | 90 | 110 | 90 |  |

TABLE 1-continued

|  | VGA 10.4" | WXGA 32" | WXGA 37" | HD 45" | REMARKS (UNIT) |
|---|---|---|---|---|---|
| CHANNEL WIDTH OF DRIVING TRANSISTOR | 400 | 600 | 700 | 600 | |
| MAXIMUM LUMINANCE | 300 NIT | | 500 NIT | | |

(*1) LARGER THAN 32", DIVIDED TO UPPER AND LOWER PORTIONS.
(*2) CHANNEL LENGTH IS 6.28 μm.

TABLE 2

|  | VGA 10.4" | WXGA 32" | WXGA 37" | HD 45" | |
|---|---|---|---|---|---|
| C1 | 6.89 | 7.94 | 11.03 | 15.51 | pF |
| C2 | 1.17 | 0.94 | 0.94 | 1.32 | pF |
| C3 | 8.07 | 9.74 | 11.92 | 13.68 | pF |
| C4 | 0.47 | 0.71 | 0.83 | 0.71 | pF |
| C5 | 4.87 | 11.68 | 16.77 | 12.15 | pF (*1) |
| UPPER LIMIT OF $C_{pd}$ | 5.37 | 7.75 | 10.37 | 10.84 | pF |
| LOWER LIMIT OF $C_{pd}$ | 1.13 | 1.63 | 2.18 | 2.28 | |
| UPPER LIMIT OF $C_{total}$ | 26.84 | 38.76 | 51.96 | 54.21 | pF |
| LOWER LIMIT OF $C_{total}$ | 22.60 | 32.64 | 43.67 | 45.65 | |

(*1) (APERTURE RATIO 30%)

In TABLE 2, "C1" denotes parasitic capacitance at an overlapping portion of the data lines 3 and supply lines 4, "C2" denotes parasitic capacitance at an overlapping portion of the data lines 3 and scanning lines 2, "C3" denotes parasitic capacitance relating to the product of the number of the scanning lines and the switching transistors 5, "C4" denotes parasitic capacitance at the gate of the driving transistor 7, and "C5" denotes capacitance of the pixel electrodes 12 and the capacitor 8. Further, in TABLE 2, "UPPER LIMIT OF $C_{pd}$" denotes parasitic capacitance $C_{pd}$ at which the thickness of the partition wall 20 calculated using the expression (2) and capacitances C1 to C5 can reach the lower limit, and "LOWER LIMIT OF $C_{pd}$" denotes parasitic capacitance $C_{pd}$ at which the thickness of the partition wall 20 calculated using the expression (2) and capacitances C1 to C5 can reach the upper limit. Further, in TABLE 2, "LOWER LIMIT OF $C_{total}$" denotes parasitic capacitance $C_{total}$ where the parasitic capacitance $C_{pd}$ is at the lower limit, and "UPPER LIMIT OF $C_{total}$" denotes parasitic capacitance $C_{total}$ where the parasitic capacitance $C_{pd}$ is at the upper limit.

Figure 7:
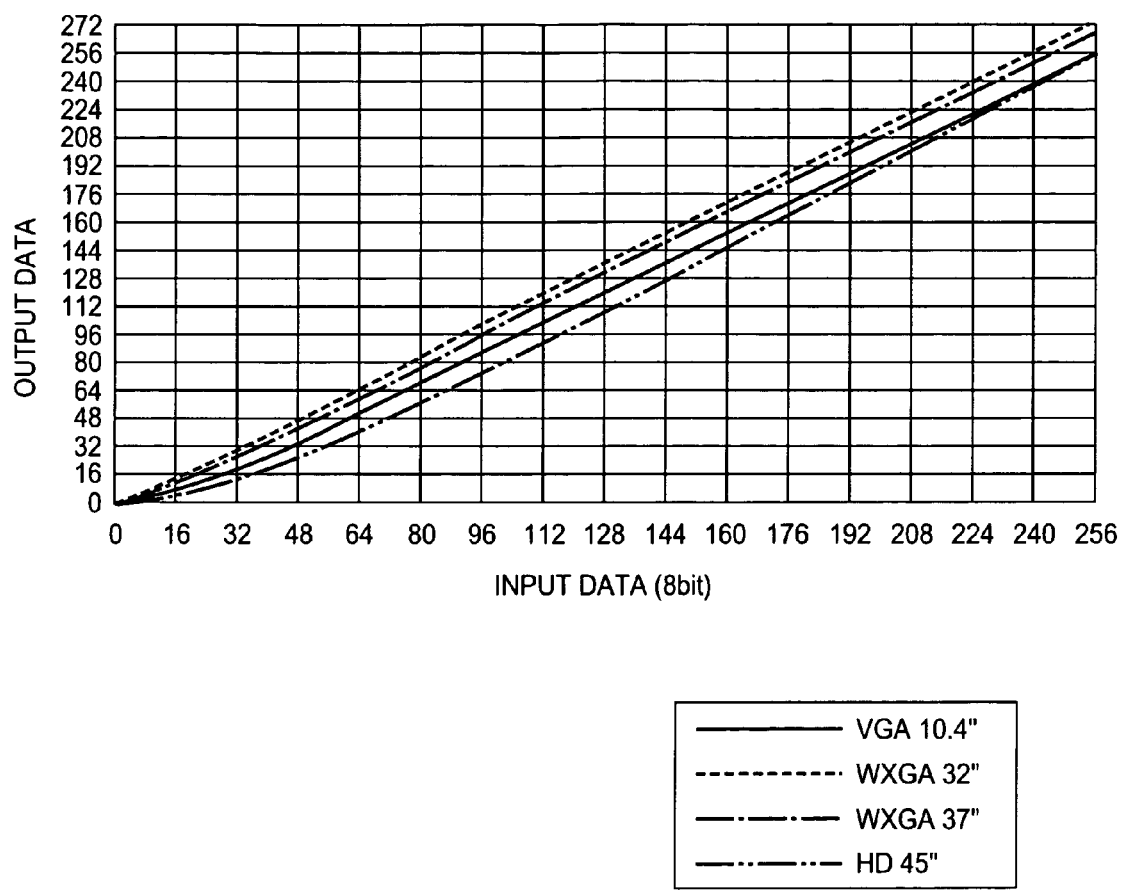
FIG. 7 is a graph showing output gradation characteristics.

Output gradient characteristics of the display panel 1 of various sizes are shown in FIG. 7, where the parasitic capacitance $C_{pd}$ has been set to the lower limit. Writing ratios at the second gradient and 255 gradient are given in TABLE 3. In FIG. 7, the lateral axis of "Input data" represents in units of 8 bits gradients of data current controlled by the data-line driver 23 to flow through the data lines 3, and the longitudinal axis of "Output data" represents in units of 8 bits gradients of the driving current flowing through the organic EL elements 10. In each case, data takes not less than 256 as a matter of convenience for easy review, but in the case of 8 bits, data reaches up to 255 in effect. It will be understood from TABLE 3 that the writing ratio is not less than 20% at the second gradient and the writing ratio is not less than 90% at $255^{th}$ gradient or at the maximum luminance.

TABLE 3

| input | VGA 10.4" | WXGA 32" | WXGA 37" | HD 45" |
|---|---|---|---|---|
| 2 | 22% | 43% | 24% | 29% |
| 255 | 100% | 107% | 104% | 100% |

In TABLE 4 are given the lower limits of the thicknesses $D_b$, i.e. the thicknesses $D_b$ of the partition wall 20 at which the parasitic capacitance $C_{pd}$ is not larger than 20% of the parasitic capacitance $C_{total}$, and in TABLE 5 are given the upper limits of the thicknesses $D_b$, i.e. the thicknesses $D_b$ of the partition wall 20 at which the parasitic capacitance $C_{pd}$ is not less than 5% of the parasitic capacitance $C_{total}$.

TABLE 4

| $\epsilon_b$ | VGA 10.4" | WXGA 32" | WXGA 37" | HD 45" |
|---|---|---|---|---|
| 2.6 | 2.7 | 2.3 | 2.0 | 2.4 |
| 3.0 | 3.1 | 2.6 | 2.3 | 2.7 |
| 3.4 | 3.5 | 3.0 | 2.6 | 3.0 | unit: μm

TABLE 5

| $\epsilon_b$ | VGA 104." | WXGA 32" | WXGA 37" | HD 45" |
|---|---|---|---|---|
| 2.6 | 13.5 | 11.5 | 10.1 | 11.8 |
| 3.0 | 15.6 | 13.3 | 11.7 | 13.6 |
| 3.4 | 17.7 | 15.1 | 13.2 | 15.4 | unit: μm

As will be understood in TABLE 4, thicknesses of the partition wall 20 having the minimum required relative dielectric constant $\epsilon_b$ of 2.6 to 3.4 fall within the range of 2.0 to 3.5 μm. Further, it will be understood from TABLE 5 that the upper limits of the thicknesses of the partition wall 20 having the relative dielectric constant $\epsilon_b$ of 2.6 to 3.4 limited by parasitic capacitance fall within the range of 10.1 to 17.7 μm.

Figure 8:
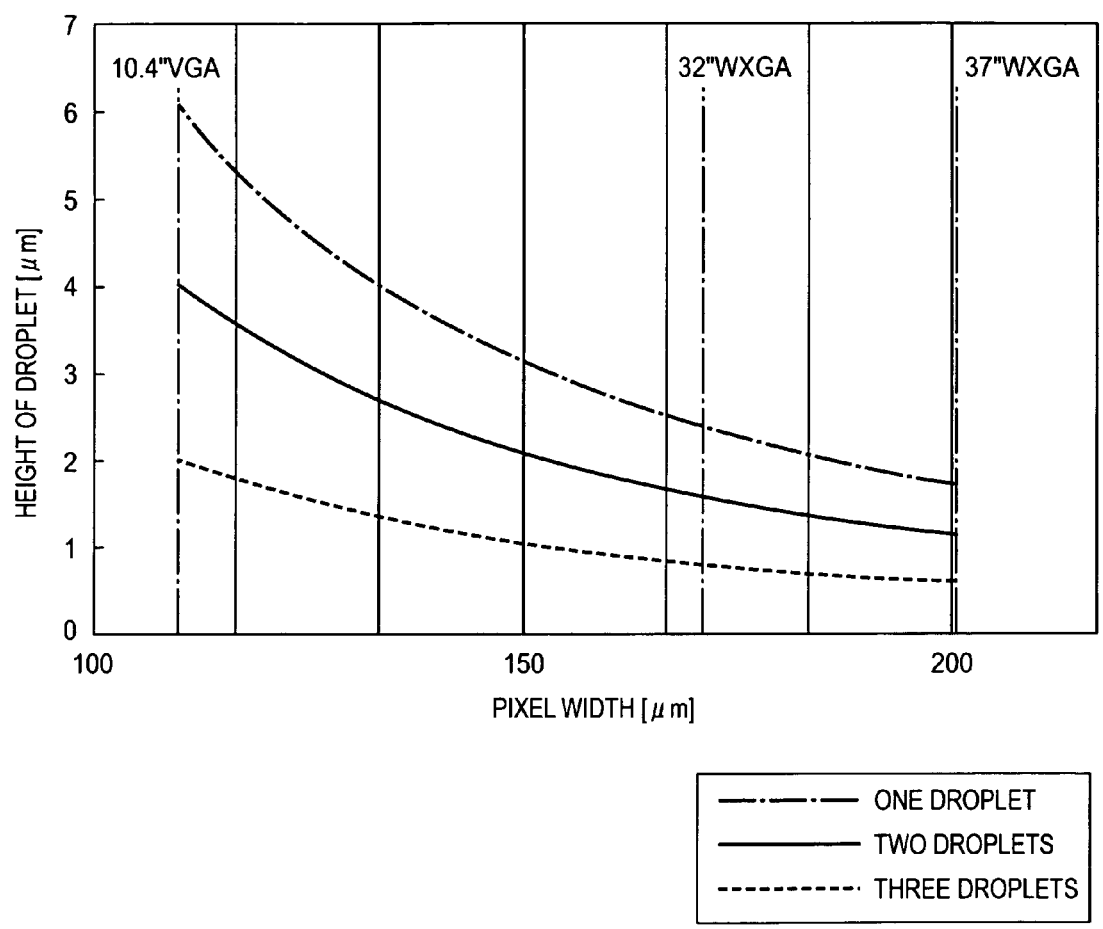
FIG. 8 is a graph showing the relationship between the width of a pixel and the height of a droplet.

In the above embodiment of the invention, the thicknesses of the partition wall 20 are optimized based on the parasitic capacitance relating to the data lines 3. Hereinafter, it will be described that the thicknesses of the partition wall 20 are optimized based on properties of films of the organic EL compound layers of the organic EL element 10. The organic compound layers 14 are formed by pouring into portions defined by the partition wall 20 and 20 solution of a material to be used to make the organic compound layer 14 or fluid dispersion of the material to be used to make the organic compound layer 14. In the case where the organic compound layer 14 is made by an ink jet method, one to several tens of droplets are discharged every pixel depending on a volume of droplet. The thickness of the partition wall 20 can be expressed by an expression (3), which is required to prevent the droplets form running over the partition wall 20 to the adjacent pixel. Relationships between heights of droplets and widths of the pixel are shown in FIG. 8. In the expression (3), a reference W denotes a width of the partition wall 20, L denotes a length of a pixel, P a pitch of pixels, and a reference ρ denotes a droplet volume. In short, a volume ρ for involving droplet for one pixel will be given by the following equation: volume ρ=width (P−W)×length L×height H. If the thickness $D_b$ of the partition wall 20 is larger than the height H calculated from the above equation, the droplets do not run over the partition wall 20 to the adjacent pixel, which is expressed by the following expression:

$$D_b > \rho/(P-W) \cdot L \qquad (3)$$

Droplets for forming the organic compound layers 14 are applied between the partition walls 20, 20. The droplets each have a volume of 60 pl, and reach a height as shown in FIG. 8. In FIG. 8, the lateral axis represents a width of the pixel and the longitudinal axis represents a height of the droplets. In VGA of 10.4", a width of three RGB pixels is 330 μm. In WXGA of 32", a width of three RGB pixels is 510 μm. In WXGA of 37", a width of three RGB pixels is 600 μm. As will be understood from FIG. 8, one droplet may be enough for forming the organic compound layer 14 for each pixel in VGA, but since the partition wall 20 requires its thickness of 2.0 μm at the minimum, which is three times the width of a pixel, the partition wall 20 needs to have the thickness of 6.0 μm finally to obtain a layer having an even thickness allover the surface by dropping one droplet to each of three pixels.

In the embodiments of the invention described above, since the thickness $D_b$ of the partition wall 20 is set so as to satisfy the expression (2), the delay of data current caused by the parasitic capacitance between the counter electrode 16 and data lines 3 can be suppressed.

What is claimed is:

1. A display panel including a plurality of pixels, each of the pixels comprising:
    a light emitting element which emits light in accordance with a driving current;
    a pixel circuit having a driving transistor connected to the light emitting element in series;
    a data line to which a data current is supplied through the pixel circuit;
    a scanning line for selecting the pixel circuit;
    a first insulation film to cover the data line; and
    a second insulation film made of a material different from the first insulation film, to cover the data line and the first insulation film,
    wherein the following expression is satisfied so that a writing ratio, which is a ratio of the driving current to the data current, is larger than 20% at a second luminance gradient and is larger than 90% at a maximum luminance gradient:

$$\frac{C_{total}}{20} \leq \varepsilon_0 \frac{\varepsilon_a \varepsilon_b}{\varepsilon_a D_b + \varepsilon_b D_a} \leq \frac{C_{total}}{5}$$

wherein a first luminance gradient is a gradient such that the light emitting element emits the light at a first brightness luminosity, which is a darkest luminosity other than a no light emitting state, the second luminance gradient is a gradient such that the light emitting element emits the light at a second brightness luminosity, which is a second-darkest luminosity, and the maximum luminance gradient is a gradient such that the light emitting element emits the light at a brightest luminosity,
    wherein $C_{total}$ denotes a parasitic capacitance of a whole path to the data line through the pixel circuit, $\varepsilon_0$ denotes a vacuum dielectric constant, $\varepsilon_a$ denotes a relative dielectric constant of the first insulation film, $D_a$ denotes a thickness of the first insulation film, $\varepsilon_b$ denotes a relative dielectric constant of the second insulation film, and $D_b$ denotes a thickness of the second insulation film,
    wherein the driving transistor includes a gate electrode and a semiconductor film, and
    wherein the first insulation film includes a gate insulation film which is provided between the gate electrode and the semiconductor film and covers the data line.

2. The display panel as claimed in claim 1, wherein the second insulation film has a relative dielectric constant of 2.6 to 3.4, and has a thickness of 2.0 to 17.7 μm.

3. The display panel as claimed in claim 1, wherein the first insulation film includes an overcoat insulation film to cover the driving transistor.

4. The display panel as claimed in claim 3, wherein the gate insulation film and the overcoat insulation film are made of the same material.

5. The display panel as claimed in claim 3, wherein the gate insulation film and the overcoat insulation film are made of one of silicon nitride and oxide silicon.

6. The display panel as claimed in claim 3, wherein the gate insulation film is in contact with the overcoat insulation film above the data line.

7. The display panel as claimed in claim 1, wherein the first insulation film includes a protection film which is formed together with a channel protection film by patterning a layer which comes to be the channel protection film of the driving transistor.

8. The display panel as claimed in claim 1, wherein the first insulation film comprises at least two films selected from a group comprising the gate insulation film, an overcoat insulation film, and a channel protection film, and the at least two films have the same relative dielectric constant.

9. The display panel as claimed in claim 1, wherein the first insulation film comprises at least two films selected from a group comprising the gate insulation film, an overcoat insulation film, and a channel protection film, and the at least two films are made of the same material.

10. The display panel as claimed in claim 1, wherein the light emitting element comprises an organic compound layer, and the second insulation film forms a partition wall to divide the organic compound layer into lines of the pixels.

11. The display panel as claimed in claim 1, wherein a counter electrode is formed on the second insulation film.

12. The display panel as claimed in claim 1, wherein the pixel circuit is of a current-drive type in which the driving current has a current value based on a current value of the data current flowing through the data line.

* * * * *